US012648340B2

(12) United States Patent
Choi et al.

(10) Patent No.: US 12,648,340 B2
(45) Date of Patent: Jun. 2, 2026

(54) ELECTROLUMINESCENCE DISPLAY

(71) Applicant: LG Display Co., Ltd., Seoul (KR)

(72) Inventors: Howon Choi, Gyeonggi-do (KR);
Taehyeon Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 392 days.

(21) Appl. No.: 18/144,648

(22) Filed: May 8, 2023

(65) Prior Publication Data

US 2023/0380246 A1 Nov. 23, 2023

(30) Foreign Application Priority Data

May 20, 2022 (KR) ........................ 10-2022-0062149
Dec. 26, 2022 (KR) ........................ 10-2022-0184020

(51) Int. Cl.
*H10K 59/00* (2023.01)
*H10K 59/122* (2023.01)
*H10K 59/80* (2023.01)
*H10K 102/00* (2023.01)

(52) U.S. Cl.
CPC ......... *H10K 59/875* (2023.02); *H10K 59/122* (2023.02); *H10K 2102/331* (2023.02); *H10K 2102/351* (2023.02)

(58) Field of Classification Search
CPC .... H10K 59/875; H10K 59/879; H10K 59/12; H10K 59/122
See application file for complete search history.

(56) References Cited

U.S. PATENT DOCUMENTS

2019/0348624 A1* 11/2019 Kim ........................ H10K 50/11
2020/0161389 A1* 5/2020 Lee ................... H01L 21/02675

FOREIGN PATENT DOCUMENTS

| KR | 10-2013-0116559 A | 10/2013 |
| KR | 10-2014-0090070 A | 7/2014 |
| KR | 10-2021-0034194 A | 3/2021 |

* cited by examiner

*Primary Examiner* — Reema Patel
(74) *Attorney, Agent, or Firm* — Birch, Stewart, Kolasch & Birch, LLP

(57) ABSTRACT
Discussed is a light emitting display including a substrate, a display area having a pixel, and a non-display area surrounding the display area, a planarization layer on the substrate, a nano base layer on the planarization layer, and having a plurality of nano patterns on an upper surface of the nano base layer, a first buffer layer on the nano base layer, an anode electrode disposed on the first buffer layer at the pixel, a bank covering a periphery area of the anode electrode and exposing a central area of the anode electrode to define an emission area in the pixel an emission layer on the anode electrode at the exposed central area, and a cathode electrode on the emission layer.

19 Claims, 8 Drawing Sheets

ELECTROLUMINESCENCE DISPLAY

CROSS-REFERENCE TO RELATED APPLICATIONS

This application claims priority to Korean Patent Application No. 10-2022-0062149 filed on May 20, 2022 in the Republic of Korea, and Korean Patent Application No. 10-2022-0184020 filed on Dec. 26, 2022 in the Republic of Korea, where the entire contents of all these applications are hereby expressly incorporated by reference into the present application.

BACKGROUND

Field

The present disclosure relates to an electroluminescence display including a light emitting device having nano structures. In particular, the present disclosure relates to a light emitting display in which the light extracting efficiency is improved by using nano patterns (or nano particles).

Discussion of the Related Art

Recently, various type of displays have been developed, such as the cathode ray tubes (CRTs), the liquid crystal displays (LCDs), the plasma display panels (PDPs) and the electroluminescent displays. These various types of display are used to display image data in various products such as computers, mobile phones, bank deposit and withdrawal devices (commonly called ATMs), and vehicle navigation systems according to their unique characteristics and purposes.

Among the display devices, a light emitting display has advantages such as a wide viewing angle, excellent contrast ratio, and a fast response speed, and thus has attracted attention as a next-generation display. A light emitting element used in a light emitting display generally includes an emission layer made of an organic material or an inorganic material and interposed between an anode electrode and a cathode electrode.

In the light emitting element, holes are supplied from an anode electrode and electrons are supplied from a cathode electrode, so that electrons and holes are combined in the emission layer to generate excitons. As excitons are changed from an excited state to a ground state, fluorescent molecules in the emission layer emit light to reproduce color and contrast in the light emitting display.

Power efficiency of a light emitting element is a very important factor in determining power consumption required for driving the light emitting element. As power efficiency is improved, desired luminance can be obtained with a small current, which also contributes to an extension in device life. There are various factors to increase the power efficiency of a light emitting element, but one of the main factors is to increase a coupling efficiency of holes and electrons for light extraction.

In a structure of a light emitting display that can be actually implemented, an optical waveguide can be formed between a transparent conductive layer used for an anode electrode or a cathode electrode having a relatively high refractive index and an emission layer. Therefore, about 50% of the light generated in the emission layer can be trapped inside the optical waveguide, and 30% of the light can be trapped inside the display device due to a total reflection caused by the difference in the refractive index between the glass substrate and the air layer of environment. As a result, the amount of light finally emitted toward the user can be reduced down to about 20%.

In order to overcome this problem, a method of improving light extraction efficiency of a light emitting element by inserting a micro-lens or nano-sized structure into the display device has been developed. In particular, there is a growing need to develop a light emitting display having a nano-structure, yet simplifying a manufacturing process, reducing manufacturing cost, and improving light extraction efficiency.

SUMMARY OF THE DISCLOSURE

The purpose of the present disclosure, as relating to the problems described above, is to provide a light emitting display having improved light extraction efficiency with a nano-structure. Another purpose of the present disclosure is to provide a light emitting display including nano-structures having a constant density distribution and high density without requiring a separate nanomaterial forming process.

In one embodiment, a light emitting display includes a substrate including a display area having a pixel, and a non-display area surrounding the display area; a planarization layer on the substrate; a nano base layer having a plurality of nano patterns on an upper surface, on the planarization layer; a first buffer layer on the nano base layer; an anode electrode disposed on the first buffer layer at the pixel; a bank covering a circumference area of the anode electrode and exposing a central area of the anode electrode to define an emission area in the pixel an emission layer on the anode electrode; and a cathode electrode on the emission layer.

In one embodiment, the nano base layer is deposited over the display area.

In one embodiment, the nano base layer is disposed at an area corresponding to the emission area.

In one embodiment, the light emitting display further includes a second buffer layer between the nano base layer and the planarization layer.

In one embodiment, the second buffer layer includes silicon nitride layer.

In one embodiment, the second buffer layer further includes a silicon oxide layer disposed under the silicon nitride layer.

In one embodiment, the light emitting display further includes a metal layer between the second buffer layer and the planarization layer.

In one embodiment, the metal layer is not overlapped with the nano base layer, and disposed in the display area.

In one embodiment, the metal layer is disposed over the entire display area.

In one embodiment, the metal layer includes any one of copper (Cu), molybdenum (Mo), titanium (Ti) and alloy of them.

In one embodiment, the first buffer layer includes a silicon nitride layer.

In one embodiment, the first buffer layer further includes a silicon oxide layer.

In one embodiment, the nano base layer includes indium.

In one embodiment, the pixel includes a first pixel and a second pixel. The nano base layer includes a first nano base layer disposed at the first pixel, and a second nano base layer disposed at the second pixel. The first nano base layer has a first thickness. The second nano base layer has a second thickness thinner than the first thickness.

In one embodiment, the nano pattern includes a first nano pattern distributed on the first nano base layer; and a second nano pattern distributed on the second nano base layer. The first nano pattern has a first size. The second nano pattern has a second size smaller than the first size.

In one embodiment, the pixel includes a first pixel and a second pixel. The first buffer layer is disposed at the first pixel with a first thickness, and at the second pixel with a second thickness. The second thickness is thinner than the first thickness.

In one embodiment, a first reproduced size of the nano pattern to the first buffer layer is a first size, in the first pixel. A second reproduced size of the nano pattern to the first buffer layer is a second size smaller than the first size.

In one embodiment, the pixel includes a first pixel and a second pixel. The nano base layer is disposed at the first pixel. The nano base layer is not disposed at the second pixel.

In one embodiment, at the first pixel, the nano patterns are distributed between the nano base layer and the first buffer layer. At the second pixel, the nano patterns are not disposed under the first buffer layer.

The light emitting display according to the present disclosure can provide a light emitting display with improved extraction efficiency of light generated from the emission layer by forming the nano-structure on the anode electrode. In addition, in constructing the nano-structure, the present disclosure can provide a light emitting display having high light extraction efficiency with reduced manufacturing cost by simplifying the manufacturing process in which indium-tin-oxide layer and nitride layer is deposited without any additional nano process. In addition, a light emitting display capable of low-power driving by increasing the density of nano-structures and having a uniform dispersion of nano-structures, improving light extraction efficiency, and reducing power consumption is provided.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
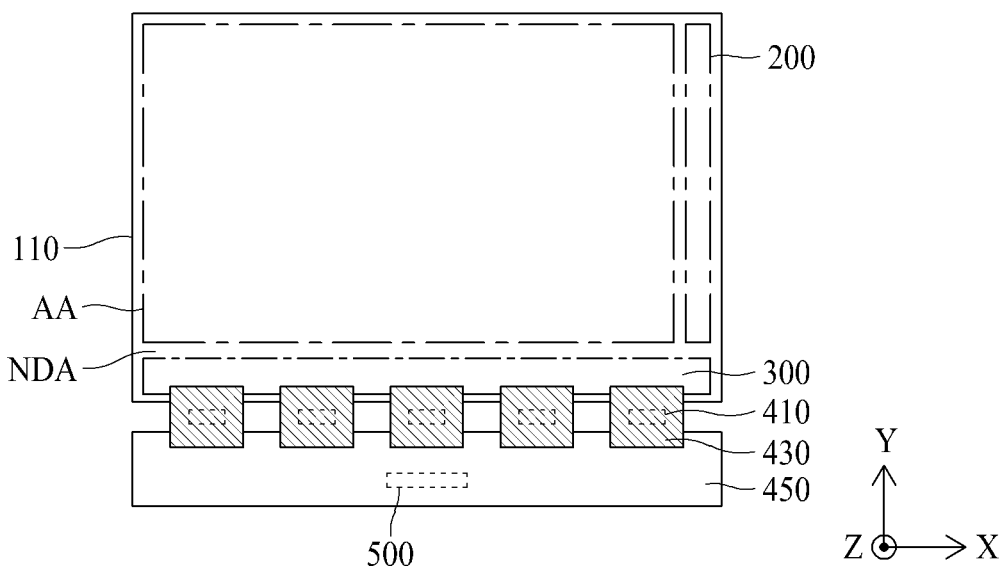
FIG. 1 is a plane view illustrating a schematic structure of a light emitting display according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration can unnecessarily obscure an important point of the present disclosure, a detailed description of such known function of configuration will be omitted.

Reference will now be made in detail to the example embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the present specification, where the terms "comprise," "have," "include," and the like are used, one or more other elements can be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third layer or element can be interposed therebetween. Further, if a first element is described as positioned "on" a second element, it does not necessarily mean that the first element is positioned above the second element in the figure. The upper part and the lower part of an object concerned can be changed depending on the orientation of the object. Consequently, where a first element is described as positioned "on" a second element, the first element can be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous can be included unless a more limiting term, such as "just," "immediate(ly)," or "direct(ly)," is used.

It will be understood that, although the terms "first," "second," and the like can be used herein to describe various elements, these elements should not be limited by these terms as they are not used to define a particular order or sequence. These terms are used only to distinguish one element from another. For example, a first element could be termed a second element, and, similarly, a second element could be termed a first element, without departing from the scope of the present disclosure.

Where an element is described as being "linked", "coupled," or "connected" to another element, that element can be directly or indirectly connected to that other element unless otherwise specified. It is to be understood that additional element or elements can be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings can be different from an actual scale for convenience of description, the present disclosure is not limited to the scale shown in the drawings.

Hereinafter, referring to the attached figures, the present disclosure will be explained. FIG. 1 is a plane view illustrating a schematic structure of an electroluminescence display according to the present disclosure. In FIG. 1, an X-axis can refer to the direction parallel to the scan line, a Y-axis can refer to the direction of the data line, and a Z-axis can refer to a height direction of the display device.

Referring to FIG. 1, a light emitting display comprises a substrate 110, a gate (or scan) driver 200, a data pad portion 300, a source driving IC (Integrated Circuit) 410, a flexible film 430, a circuit board 450, and a timing controller 500. The light emitting display can include other elements and structures. All components of each light emitting display according to all embodiments of the present disclosure are operatively coupled and configured.

The substrate 110 can include an electrical insulating material or a flexible material. The substrate 110 can be made of a glass, a metal or a plastic, but it is not limited thereto. When the electroluminescence display is a flexible display, the substrate 110 can be made of the flexible material such as plastic. For example, the substrate 110 can include a transparent polyimide material.

The substrate 110 can include a display area AA and a non-display area NDA. The display area AA, which is an area for representing the video images, can be defined as the majority middle area of the substrate 110, but it is not limited thereto. In the display area AA, a plurality of scan lines (or gate lines), a plurality of data lines and a plurality of pixels can be formed or disposed. Each of pixels can include a plurality of sub pixels. Each of sub pixels includes the scan line and the data line, respectively.

The non-display area NDA, which is an area not representing or providing the video images, can be defined at the circumference areas or the periphery of the substrate 110 surrounding all or some of the display area DA. In the non-display area NDA, the gate driver 200 and the data pad portion 300 can be formed or disposed.

The gate driver 200 can supply the scan (or gate) signals to the scan lines according to the gate control signal received from the timing controller 500. The gate driver 200 can be formed at the non-display area NDA at any one outside of the display area AA on the substrate 110, as a GIP (Gate driver In Panel) type. GIP type means that the gate driver 200 is directly formed on the substrate 110.

The data pad portion 300 can supply the data signals to the data line according to the data control signal received from the timing controller 500. For another example, the data driving element can be made as a driver chip and mounted on the flexible film 430. Further, the flexible film 430 can be attached at the data pad 300 which is located at the non-display area NDA of anyone outside of the display area AA on the substrate 110, as a TAB (Tape Automated Bonding) type.

The source driving IC 410 can receive the digital video data and the source control signal from the timing controller 500. The source driving IC 410 can convert the digital video data into the analog data voltages according to the source control signal and then supply that to the data lines. When the source driving IC 410 is made as a chip type, it can be installed on the flexible circuit film 430 as a COF (Chip On Film) or COP (Chip On Plastic) type.

The flexible circuit film 430 can include a plurality of first link lines connecting the data pad portion 300 to the source driving IC 410, and a plurality of second link lines connecting the data pad portion 300 to the circuit board 450. The flexible film 430 can be attached on the data pad portion 300 using an anisotropic conducting film, so that the data pad portion 300 can be connected to the first link lines of the flexible film 430.

The circuit board 450 can be attached to the flexible circuit film 430. The circuit board 450 can include a plurality of circuits implemented as the driving chips. For example, the circuit board 450 can be a printed circuit board or a flexible printed circuit board.

The timing controller 500 can receive the digital video data and the timing signal from an external system board through the line cables of the circuit board 450. The timing controller 500 can generate a gate control signal for controlling the operation timing of the gate driver 200 and a source control signal for controlling the source driving IC 410, based on the timing signal. The timing controller 500 can supply the gate control signal to the gate driver 200 and supply the source control signal to the source driving IC 410. Depending on the product types, the timing controller 500 can be formed as one chip with the source driving IC 410 and mounted on the substrate 110.

Figure 2:
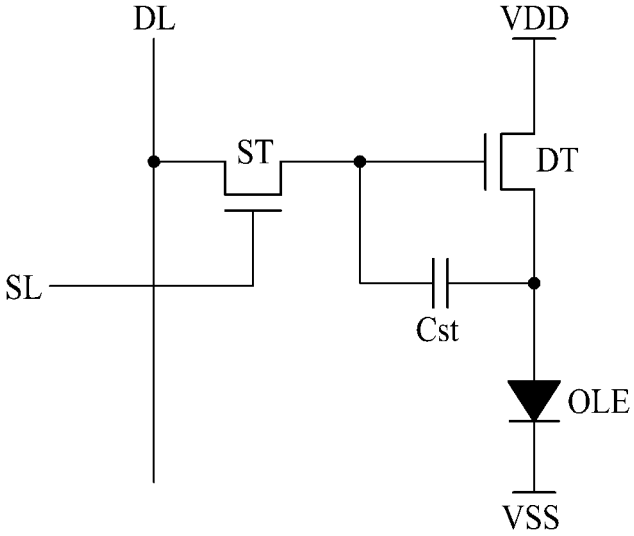
FIG. 2 is a circuit diagram illustrating a structure of one pixel included in the light emitting display according to the present disclosure.
Figure 3:
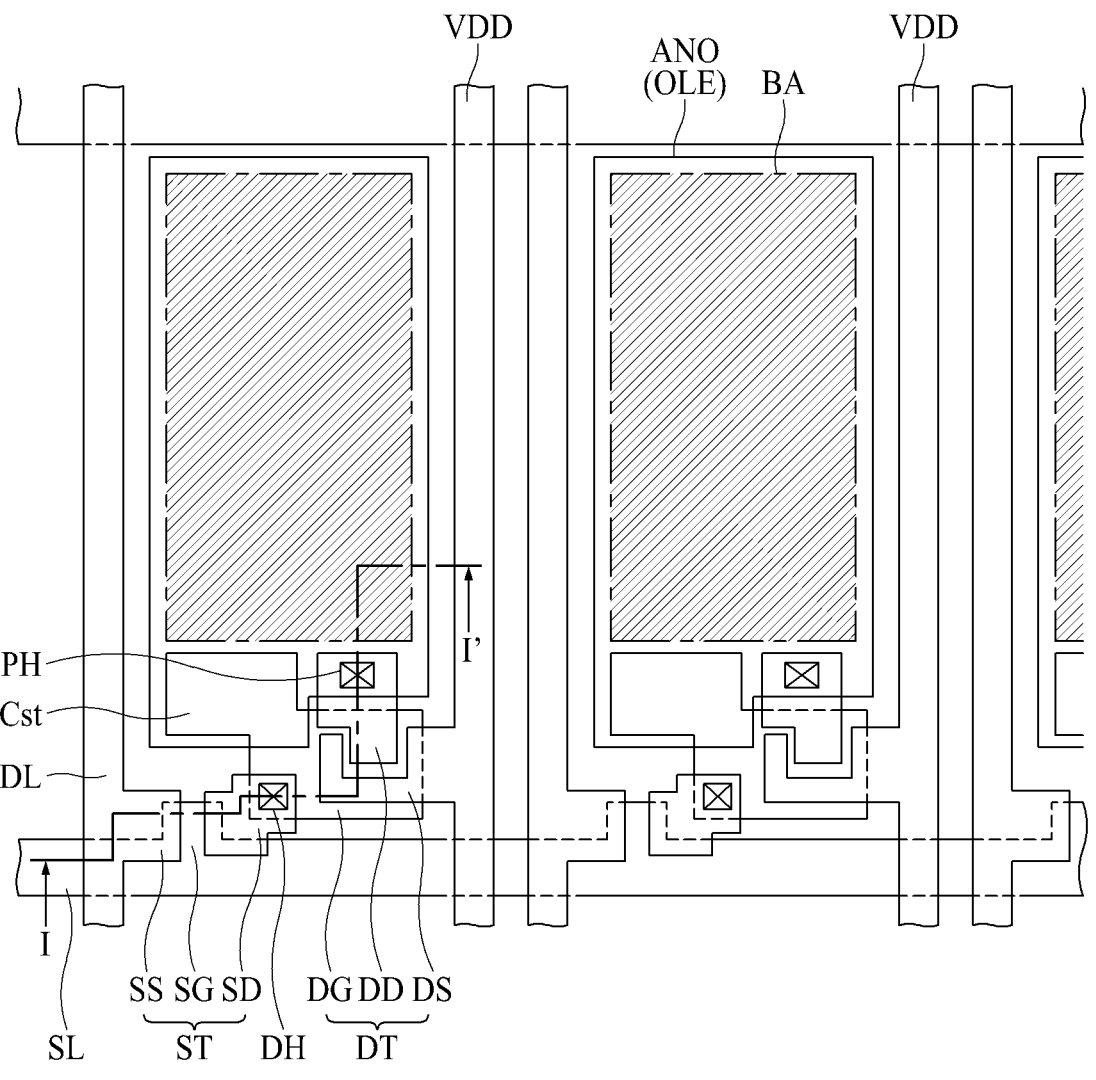
FIG. 3 is a plan view illustrating a structure of pixels disposed in the light emitting display according to the present disclosure.
Figure 4:
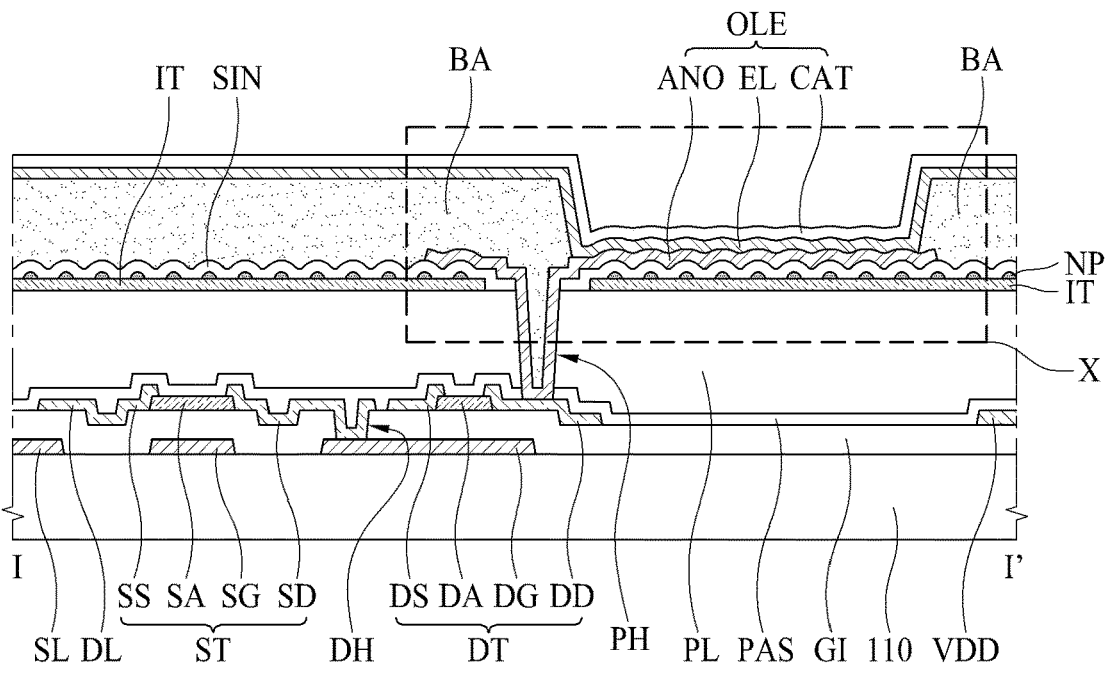
FIG. 4 is a cross-sectional view along to cutting line I-I' in FIG. 3, for illustrating a structure of the light emitting display according to a first embodiment of the present disclosure.

Hereinafter, referring to FIGS. 2 to 4, an example embodiment of the present disclosure will be explained. FIG. 2 is a circuit diagram illustrating a structure of one pixel included in the light emitting display according to the present disclosure. FIG. 3 is a plan view illustrating a structure of the pixels disposed in the light emitting display according to the present disclosure. FIG. 4 is a cross-sectional view along a cutting line I-I' in FIG. 3, for illustrating a structure of the light emitting display according to a first embodiment of the present disclosure.

Referring to FIGS. 2 to 4, one pixel of the light emitting display can be defined by a scan line SL, a data line DL and a driving current line VDD. One pixel of the light emitting display can include a switching thin film transistor ST, a driving thin film transistor DT, a light emitting diode OLE and a storage capacitance Cst. The driving current line VDD can be supplied with a high-level voltage for driving the light emitting diode OLE.

A switching thin film transistor ST and a driving thin film transistor DT can be formed on a substrate SUB. For example, the switching thin film transistor ST can be disposed at the portion where the scan line SL and the data line DL are crossing. The switching thin film transistor ST can include a switching gate electrode SG, a switching source electrode SS and a switching drain electrode SD. The switching gate electrode SG can be connected to the scan line SL. The switching source electrode SS can be connected to the data line DL and the switching drain electrode SD can be connected to the driving thin film transistor DT. By supplying the data signal to the driving thin film transistor DT, the switching thin film transistor ST can play a role of selecting a pixel which would be driven.

The driving thin film transistor DT can play a role of driving the light diode OLE of the selected pixel by the switching thin film transistor ST. The driving thin film transistor DT can include a driving gate electrode DG, a driving source electrode DS and a driving drain electrode DD. The driving gate electrode DG can be connected to the switching drain electrode SD of the switching thin film transistor ST. For example, the driving gate electrode DG can be connected to the switching drain electrode SD via the drain contact hole DH penetrating the gate insulating layer GI. The driving source electrode DS can be connected to the driving current line VDD, and the driving drain electrode DD can be connected to an anode electrode ANO of the light emitting diode OLE. A storage capacitance Cst can be disposed between the driving gate electrode DG of the driving thin film transistor DT and the anode electrode ANO of the light emitting diode OLE.

The driving thin film transistor DT can be disposed between the driving current line VDD and the light emitting diode OLE. The driving thin film transistor DT can control the amount of electric currents flowing to the light emitting diode OLE from the driving current line VDD according to the voltage level of the gate electrode DG of the driving thin film transistor DT connected to the switching drain electrode SD of the switching thin film transistor ST.

The light emitting diode OLE can include an anode electrode ANO, a light emitting layer EL and a cathode electrode CAT. The light emitting diode OLE can emit the light according to the amount of the electric current controlled by the driving thin film transistor DT. In other word, the light emitting diode OLE can be driven by the voltage differences between the low-level voltage and the high-level voltage controlled by the driving thin film transistor DT. The anode electrode ANO of the light emitting diode OLE can be connected to the drain electrode DD of the driving thin film transistor DT, and the cathode electrode CAT can be connected to a low-level voltage line Vss where a low-level potential voltage is supplied. For example, the light emitting diode OLE can be driven by the high-level voltage controlled by the driving thin film transistor DT and the low-level voltage supplied from the low-level voltage line Vss.

On the substrate 110 having the thin film transistors ST and DT, a passivation layer PAS can be deposited. The passivation layer PAS can be made of an inorganic material such as silicon oxide (SiOx) or silicon nitride (SiNx). A planarization layer PL can be deposited on the passivation layer PAS. The planarization layer PL can be a thin film for flattening or making even the non-uniform surface of the substrate 110 on which the thin film transistors ST and DT are formed. To do so, the planarization layer PL can be made of the organic materials.

On the surface of the planarization layer PL, a nano base layer IT can be deposited. The nano base layer IT can have a shape and size corresponding to the display area AA of the substrate 110, but it is not deposited on where the pixel contact hole PH is formed. On the nano base layer IT, a first buffer layer SIN can be deposited as covering the substrate 110 entirely. A plurality of nano patterns (or nano particles) NP can be formed on the top surface of the nano base layer IT.

The pixel contact hole PH can be formed for exposing some of the drain electrode DD of the driving thin film transistor DT, at the passivation layer PAS, planarization layer PL and the first buffer layer SIN. On the first buffer layer SIN, an anode electrode ANO can be formed. The anode electrode ANO can be connected to the drain electrode DD of the driving thin film transistor DT via the pixel contact hole PH.

The anode electrode ANO can have different elements according to the emission condition of the light emitting diode OLE. For the bottom emission type in which the emitted light can be provided to the substrate 110, the anode electrode ANO can be made of a transparent conductive material in one embodiment. For example, the anode electrode ANO can include a metal oxide material such as indium-zinc-oxide (IZO) or indium-tin-oxide (ITO). In the case of the top emission type in which the emitted light can be provided to the direction opposite the substrate 110, the anode electrode ANO can include a metal material with excellent reflection ratio. In this case, the anode electrode ANO can include a conductive transparent layer and a metal layer which are stacked.

On the anode electrode ANO, a bank BA can be formed. The bank BA can define an emission area by covering the circumference area of the anode electrode ANO and exposing most middle areas of the anode electrode ANO. In order to ensure uniform light emitting efficiency in the emission area, the bank BA can be formed to cover the pixel contact hole PH.

An emission layer EL can be deposited on the anode electrode ANO and the bank BA. The emission layer EL can be deposited over the whole surface of the display area AA on the substrate 110, as covering the anode electrodes ANO and banks BA. In the case of an organic light emitting display, the emission layer EL can include an organic material. In the case of an inorganic light emitting display, the emission layer EL can be made of an inorganic material.

For an example, the emission layer EL can include two or more stacked emission portions for emitting white light. In detail, the emission layer EL can include a first emission layer providing first color light and a second emission layer providing second color light, and for emitting the white light by combining the first color light and the second color light.

In another example, the emission layer EL can include at least any one of blue-light emission layer, green-light emission layer and red-light emission layer as corresponding to the color allocated to the pixel. In addition, the light emitting diode OLE can further include at least one functional layer for enhancing the light emitting efficiency and/or the service lifetime of the emission layer EL.

The cathode electrode CAT can be disposed on the emission layer EL. The cathode electrode CAT can be stacked on the emission layer EL as being surface contact each other. The cathode electrode CAT can be formed as one sheet element over the entire area of the substrate 110 as being a commonly connected whole emission layers EL disposed at all pixels. In the case of the bottom emission type, the cathode electrode CAT can include metal material having excellent light reflection ratio. For example, the cathode electrode CAT can include at least any one of silver (Ag), aluminum (Al), molybdenum (Mo), gold (Au), magnesium (Mg), calcium (Ca), or barium (Ba). Other metals or materials can also be used.

A light emitting diode OLE can be formed at the emission area where the anode electrode ANO, the emission layer EL and the cathode electrode CAT are sequentially stacked. An encapsulation layer can be further deposited on the light emitting diode OLE. The encapsulation layer can include a first inorganic encapsulation layer, an organic encapsulation layer and a second inorganic encapsulation layer, sequentially stacked on each other.

In the above description referring FIG. 4, common features of the light emitting display according to the present disclosure have been mainly explained. In the following description for specific embodiments, the characteristic parts of each embodiment will be mainly explained.

First Embodiment

Figure 5:
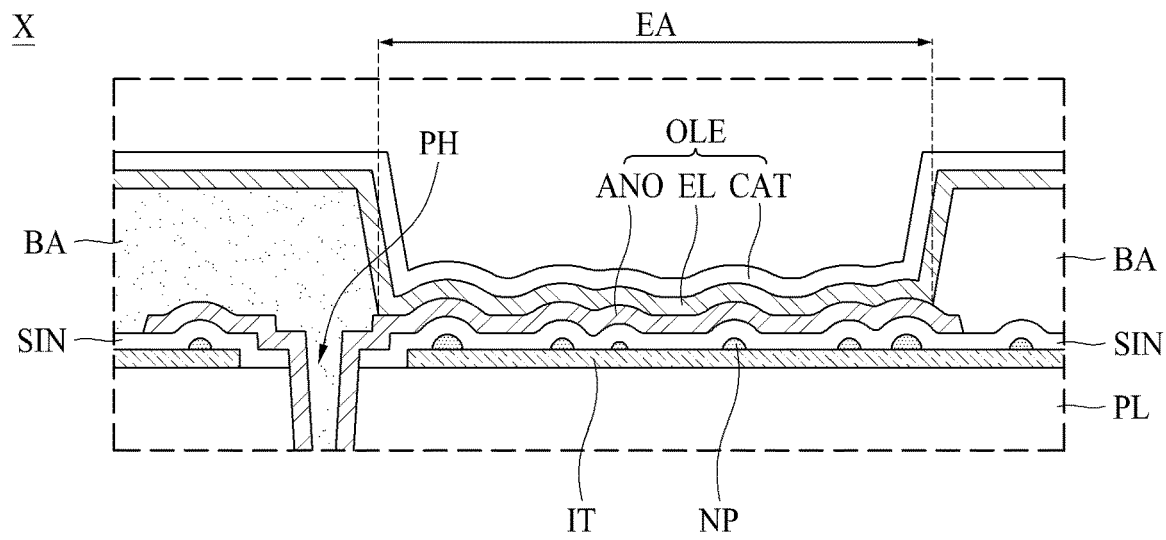
FIG. 5 is a cross-sectional view, enlarging 'X' area marked by dotted rectangular in FIG. 4, for illustrating a structure of the light emitting display according to the first embodiment of the present disclosure.

Hereinafter, referring to FIG. 5, the first embodiment of the present disclosure will be explained. FIG. 5 is a cross-sectional view, enlarging an 'X' area marked by a dotted rectangle in FIG. 4, for illustrating a structure of the light emitting display according to the first embodiment of the present disclosure.

A driving element layer can be formed on a substrate 110. A planarization layer PL is stacked on the driving element layer as covering a whole area of the substrate 110. As the detailed description for the driving element layer is the same with the above description referring to FIG. 4, so it will not be duplicated in the following explanation.

Referring to FIG. 5, a nano base layer IT can be disposed on the upper surface of the planarization layer PL. The nano base layer IT can be made of indium tin oxide (ITO). The nano base layer IT can have a plane shape corresponding to the display area AA of the substrate 110 except the area where the pixel contact hole PH is formed.

A first buffer layer SIN can be disposed on the nano base layer IT as covering the whole of the substrate 110. The first buffer layer SIN can include a nitride material. For example, the first buffer layer SIN can be made of silicon nitride. For another example, the first buffer layer SIN can be configured to include a multi-layer structure. For example, the first buffer layer SIN can include a silicon nitride layer and a silicon oxide layer which are stacked on each other.

In the process for depositing the first buffer layer SIN, hydrogen particles combine with oxygen of the indium-tin-oxide included in the nano base layer IT, and indium materials are precipitated to form nano patterns NP. The first buffer layer SIN can be deposited on the substrate 110 as covering the nano base layer IT having the nano patterns NP. As the first buffer layer SIN can be made of an inorganic material, the first buffer layer SIN can have an uneven upper surface by reflecting or taking on the shape of the nano pattern (or nano patterns) NP on the surface of the nano base layer IT. In embodiments of the present disclosure, the nano patterns NP can include indium, a combination of indium and tin, or other materials, such as silicon, nitrogen, oxygen or a combination thereof.

A pixel contact hole PH can be formed at the passivation layer PAS, the planarization layer PL and the first buffer layer SIN for exposing some of the drain electrode DD of the driving thin film transistor DT. An anode electrode ANO can be formed on the first buffer layer SIN. Therefore, the anode electrode ANO can have an uneven upper surface by directly reflecting or taking on the protrusion shape of the nano patterns NP formed on the upper surface of the first buffer layer SIN.

Since the thickness of the emission layer EL can be relatively thin, where the emission layer EL has an organic material or an inorganic material, protrusions appearing on the surface of the anode electrode ANO can be reproduced or projected on the surface of the emission layer EL. As the first buffer layer SIN and the anode electrode ANO are stacked on the nano patterns NP and then the emission layer EL can be stacked thereon, the emission layer EL can have a more gentle protruding shape than the protruding shape of the nano patterns NP on the surface nano base layer IT.

A cathode electrode CAT can be disposed on the emission layer EL. Protrusions are formed on the surface of the anode electrode ANO by the nano pattern NP, and the emission layer EL interposed between the anode electrode ANO and the cathode electrode CAT is not formed as a flat thin film having a constant thickness, so that the light waveguide path is not formed. Therefore, among the lights generated in the emission layer EL, the amount of light extracted to the outside is greater than the amount of light trapped between the anode electrode ANO and the cathode electrode CAT, and thus light extraction efficiency can be improved.

In the light emitting display according to the first embodiment, the nano base layer IT having the nano patterns NP on its upper surface is deposited over the whole surface of the display area AA of the substrate 110. As the nano base layer IT has a conductive material, it should be electrically isolated from the anode electrode ANO and/or drain electrode DD of the driving thin film transistor DT. To do so, it is preferable, but not required, that the nano base layer IT has a sheet shape which is not deposited where the pixel contact hole PH is formed.

Like this way, when the nano base layer IT is stacked over the entire substrate 110, there can be a problem in which the nano patterns NP are not formed with a uniform size and uniform distribution over the entire display area AA. In this case, each pixel can have a different light extraction efficiency, so the luminance may not be constant over whole display area AA. In the following embodiments, light emitting displays including the nano patterns NP having a uniform size and uniform distribution by further solving this problem will be described.

Second Embodiment

Figure 6:
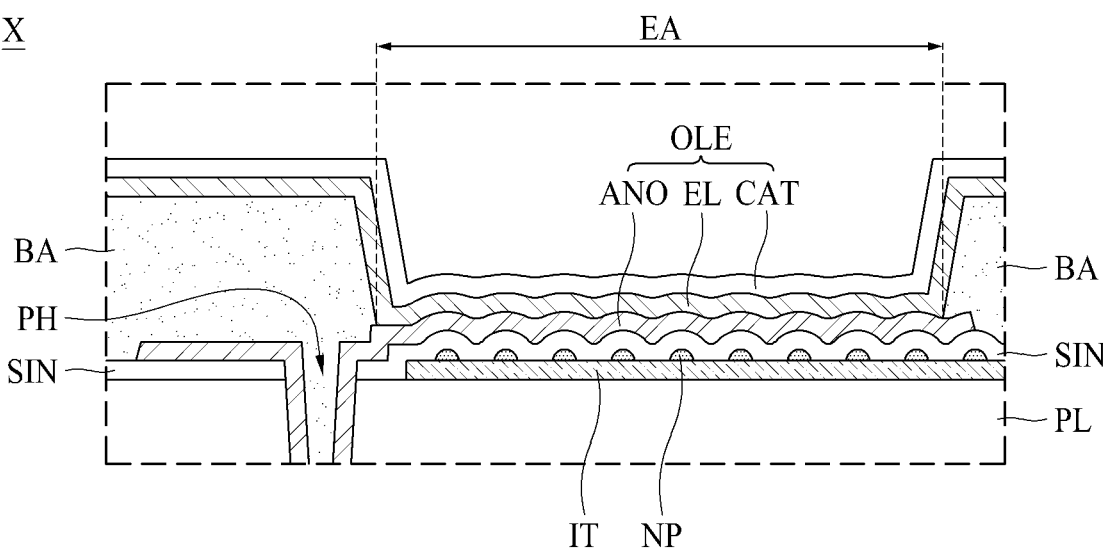
FIG. 6 is a cross-sectional view, enlarging 'X' area marked by dotted rectangular in FIG. 4, for illustrating a structure of the light emitting display according to a second embodiment of the present disclosure.

Hereinafter, referring to FIG. 6, a light emitting display according to the second embodiment of the present disclosure will be explained. FIG. 6 is a cross-sectional view, enlarging an 'X' area marked by a dotted rectangle in FIG. 4, for illustrating a structure of the light emitting display according to the second embodiment of the present disclosure.

Referring to FIG. 6, the structure of a light emitting display according to the second embodiment has elements that are similar with that of the light emitting display according to the first embodiment. The differentiated feature of the second embodiment is that the nano base layer IT on which the nano patterns NP are formed is arranged to have a size and shape corresponding to the light emitting area EA without being continuously disposed over the entire display area AA.

For an example, the nano base layer IT can have the same shape as one of light emitting area EA, and can be patterned in an island shape with a slightly larger size than each of the light emitting area EA. In addition, it is preferable, but not required, for the nano base layer IT to be spaced apart from the pixel contact hole PH by a predetermined distance. For example, the light emitting area EA can be formed in various geographic shapes, such as a quadrangle, rhombus, parallelogram, hexagon, octagon, circle or ellipse. The nano base layer IT can be formed to have the same shape as that of each light emitting area EA, and can be patterned to have a slightly larger size than each of the light emitting area EA.

When the nano base layer IT is formed over the entire display area AA as in the first embodiment, during the process of depositing the first buffer layer SIN on the nano base layer IT, there can be a problem in that a sufficient amount of nano patterns NP from indium precipitation may not be formed due to the limited amount of hydrogen particles.

However, as in the second embodiment, when the nano base layer IT has the same shape as the light emitting area EA and has a slightly larger size, the amount of oxygen contained in the indium-tin-oxide reacting with the limited amount of the hydrogen particles can be increased, so a larger amount of indium precipitation can occur. Accordingly, the light emitting display according to the second embodiment can have a larger amount of nano patterns NP per unit area than the first embodiment. As a result, it is possible to provide a light emitting display with further increased light extraction efficiency.

Third Embodiment

Figure 7:
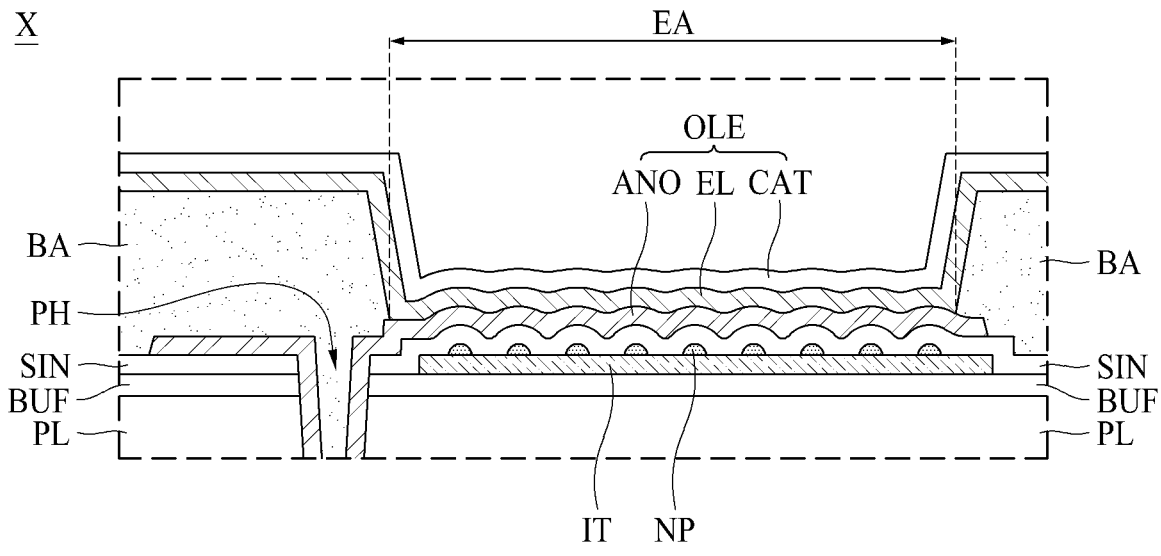
FIG. 7 is a cross-sectional view, enlarging 'X' area marked by dotted rectangular in FIG. 4, for illustrating a structure of the light emitting display according to a third embodiment of the present disclosure.

Hereinafter, referring to FIG. 7, a light emitting display according to the third embodiment of the present disclosure will be explained. FIG. 7 is a cross-sectional view, enlarging an 'X' area marked by the dotted rectangle in FIG. 4, for illustrating a structure of the light emitting display according to the third embodiment of the present disclosure.

Referring to FIG. 7, the structure of a light emitting display according to the third embodiment has elements that are similar with that of the light emitting display according to the second embodiment. The differentiated feature of the third embodiment is that a second buffer layer BUF is further disposed under the nano base layer IT and over the planarization layer PL. The second buffer layer BUF can be made of an inorganic material. For example, the second buffer layer BUF can include a silicon nitride material. For another example, the second buffer layer BUF can have a multi-layered structure having a silicon oxide layer and a silicon nitride layer.

With the second buffer layer BUF being made of silicon nitride before the depositing of the nano base layer IT, when depositing the nano base layer IT, it can be deposited under a hydrogen atmosphere. Therefore, the nano pattern NP can be formed even during the process of depositing the nano base layer IT. Further, when the first buffer layer SIN is deposited on the nano base layer IT, the nano pattern NP can be formed.

As a result, in the structure according to the third embodiment, a larger amount of nano patterns NP than the second embodiment can be provided. So, a light emitting display with more improved light extraction efficiency can be acquired.

In the first embodiment referring to FIG. 5, the second buffer layer BUF can be further included between the nano base layer IT and the planarization layer PL. In this case, more nano patterns NP are formed, and light extraction efficiency can be further improved.

Fourth Embodiment

Figure 8:
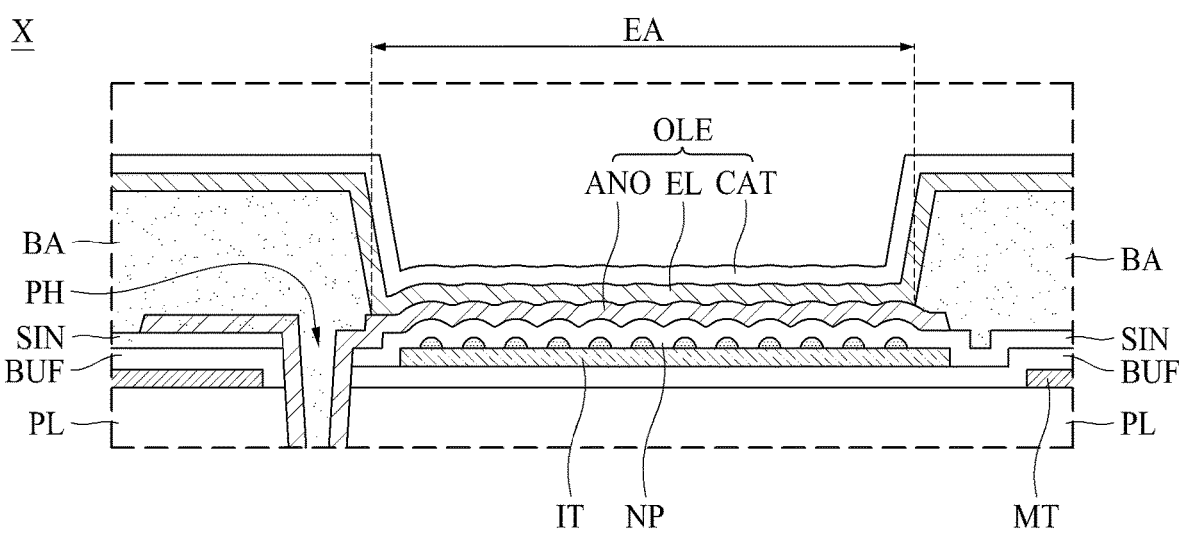
FIG. 8 is a cross-sectional view, enlarging the rectangular area X in FIG. 4, for illustrating a structure of the light emitting display according to a fourth embodiment of the present disclosure.

Hereinafter, referring to FIG. 8, a structure of the light emitting display according to the fourth embodiment will be explained. FIG. 8 is a cross-sectional view, enlarging the rectangular area X in FIG. 4, for illustrating a structure of the light emitting display according to the fourth embodiment of the present disclosure.

Referring to FIG. 8, the structure of a light emitting display according to the fourth embodiment includes elements similar with that of the light emitting display according to the third embodiment. The differentiated feature of the fourth embodiment is that a metal layer MT can be further disposed under the second buffer layer BUF and over the planarization layer PL. In particular, the metal layer MT is not disposed over the entire display area AA of the substrate 110, and is disposed so as not to overlap with the nano base layer IT. The metal layer MT can include a metal material that does not transmit light. For example, the metal layer MT can be made of copper (Cu), molybdenum (Mo), titanium (Ti) or any alloy thereof. Since the nano base layer IT can be made of indium-tin-oxide and can be a transparent conductive material, the nano base layer IT can transmit light. Therefore, the structure illustrated in FIG. 8 can be preferably applied to a bottom emission type light emitting display, but such is not required.

The metal layer MT can have tensile stress. Therefore, due to the tensile stress of the metal layer MT, crystal cracks can more easily occur in the nano base layer IT stacked on the metal layer MT. In that case, the contact area between the nano base layer IT and the hydrogen particles are deposited increases, and more of the hydrogen particles are generated during the deposition of the second buffer layer BUF and the first buffer layer SIN. Therefore, more nano patterns NP can occur with a more uniform distribution. As a result, a light emitting display with further improved light extraction efficiency can be provided.

In the first embodiment referring to FIG. 5, the metal layer MT and the second buffer layer BUF can be further included between the nano base layer IT and the planarization layer PL. In this case, more nano patterns NP are formed, and light extraction efficiency can be further improved.

Fifth Embodiment

Figure 9:
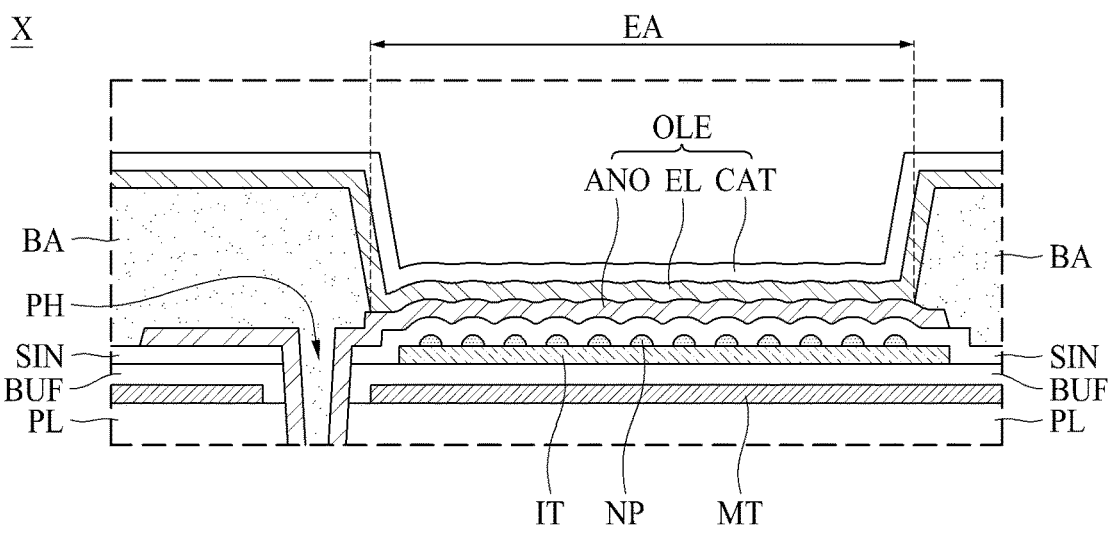
FIG. 9 is a cross-sectional view, enlarging the rectangular area X in FIG. 4, for illustrating a structure of the light emitting display according to a fifth embodiment of the present disclosure.

Hereinafter, referring to FIG. 9, a structure of the light emitting display according to the fifth embodiment will be explained. FIG. 9 is a cross-sectional view, enlarging the rectangular area X in FIG. 4, for illustrating a structure of the light emitting display according to the fifth embodiment of the present disclosure.

Referring to FIG. 9, the structure of a light emitting display according to the fifth embodiment includes elements similar with that of the light emitting display according to the fourth embodiment. The differentiated feature of the fifth embodiment is that a metal layer MT disposed between the second buffer layer BUF and the planarization layer PL is deposited over the entire display area AA. However, since the metal layer MT is formed of a metal material, in order not to be electrically connected to the anode electrode ANO or the drain electrode DD of the driving thin film transistor DT, the metal layer MT can have a shape that is not deposited at a portion where the pixel contact hole PH is located.

The metal layer MT can include a metal material that does not transmit light. For example, the metal layer MT can be made of copper (Cu), molybdenum (Mo), titanium (Ti) or any alloy thereof. For the structure of the light emitting display shown in FIG. 9, the metal layer MT is disposed at the emission area EA under the emission layer EL. Therefore, the structure illustrated in FIG. 9 is preferably applied to a top emission type light emitting display, but such is not required.

The metal layer MT can have a tensile stress. Therefore, due to the tensile stress of the metal layer MT, crystal cracks can more easily occur in the nano base layer IT stacked on the metal layer MT. In that case, the contact area between the nano base layer IT and the hydrogen particles are deposited increases, and more of the hydrogen particles are generated during the deposition of the second buffer layer BUF and the first buffer layer SIN. Therefore, more nano patterns NP can occur with a more uniform distribution. As a result, a light emitting display with a further improved light extraction efficiency can be provided.

In the first embodiment referring to FIG. 5, the metal layer MT and the second buffer layer BUF can be further included between the nano base layer IT and the planarization layer PL. As a result, more nano patterns NP are formed, and light extraction efficiency can be further improved.

For example, according to the second embodiment to the fifth embodiment of the present disclosure, from a view point of the distribution of nano structure (or nano patterns) NP, about 90% of the nano structures with a size of 40 to 100 nm are distributed, and about 10% of the nano structures (or nano patterns) NP having a size of 200 to 400 nm are distributed. For example, for the case that the patterned nano base layer IT is provided for each pixel area, and the first buffer layer SIN is stacked thereon, or additionally, the second buffer layer BUF is stacked under the nano base layer IT, or the metal layer MT is stacked under the second buffer layer BUF, the nano structures (or nano patterns) NP can have a relatively uniform size and be more densely formed.

Sixth Embodiment

Figure 10:
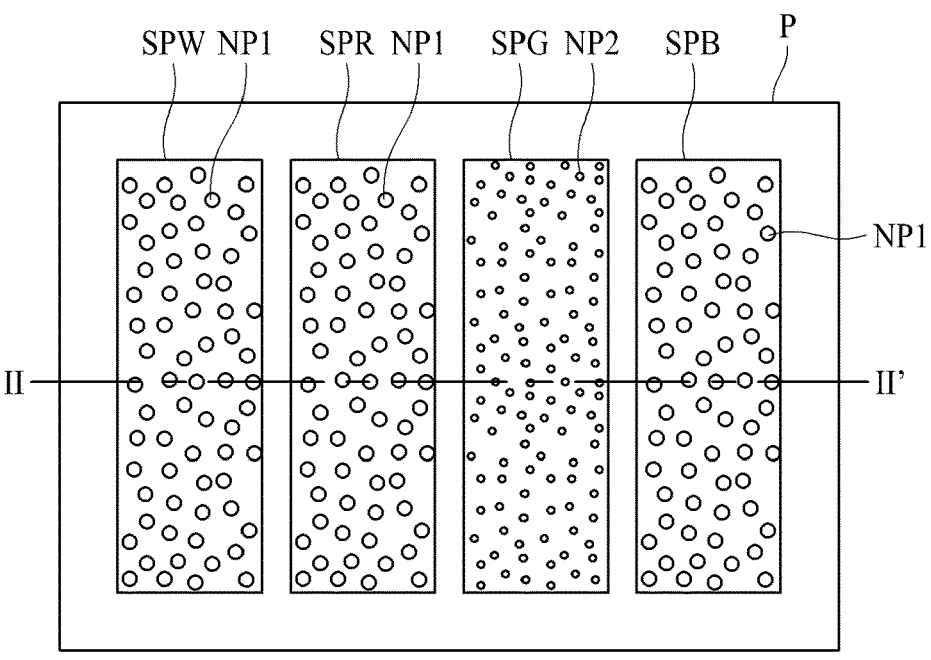
FIG. 10 is an enlarged plane view illustrating a structure of four sub pixels included in one pixel disposed in the light emitting display according to a sixth embodiment of the present disclosure.
Figure 11:
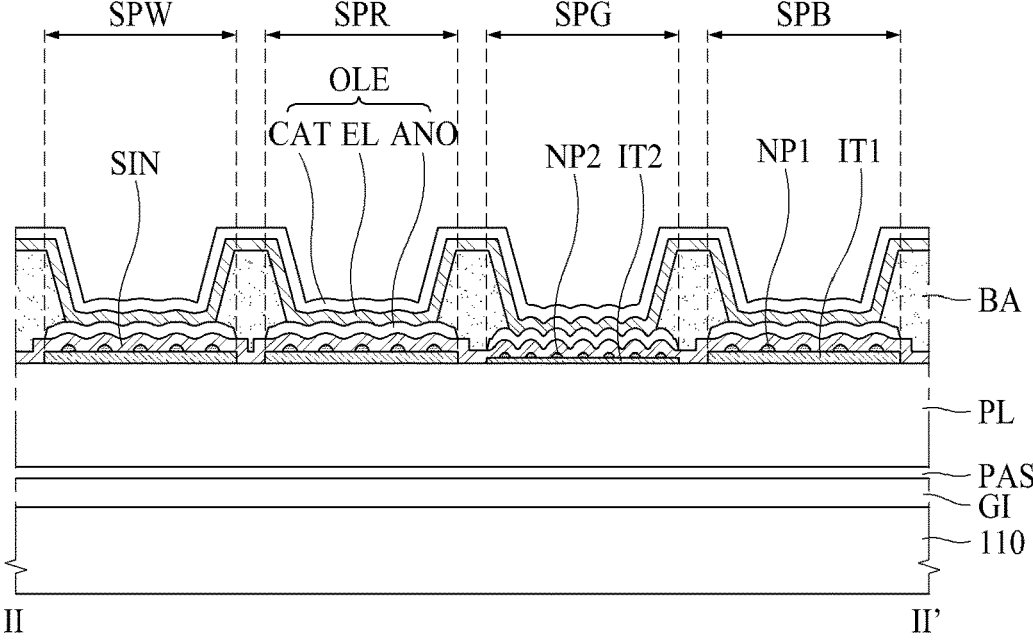
FIG. 11 is a cross sectional view, cutting along line II-II' in FIG. 10, for illustrating a structure of the light emitting display according to the sixth embodiment of the present disclosure.

Hereinafter, referring to FIGS. 10 and 11, a structure of the light emitting display according to the sixth embodiment will be explained. FIG. 10 is an enlarged plane view illustrating a structure of four sub pixels included in one pixel disposed in the light emitting display according to the sixth embodiment of the present disclosure. FIG. 11 is a cross sectional view, cutting along line II-II' in FIG. 10, for illustrating a structure of the light emitting display according to the sixth embodiment of the present disclosure.

A light emitting display according to the sixth embodiment of the present disclosure includes a plurality of pixels arrayed in a matrix manner on the substrate 110. Referring to FIG. 10, one pixel P can include four sub-pixels. For example, one pixel P can include a white sub-pixel SPW, a red sub-pixel SPR, a green sub-pixel SPG and a blue sub-pixel SPB.

A plurality of nano patterns can be distributed over the plurality of sub-pixels. For example, at the white sub-pixel SPW, the red sub-pixel SPR and the blue sub-pixel SPB, a plurality of first nano patterns NP1 are distributed. In the interim, at the green sub-pixel SPG, a plurality of second nano patterns NP2 having smaller diameter than the first nano pattern NP1 are distributed.

Referring to FIG. 11 illustrating a cross-sectional structure of the light emitting display, a gate insulating layer GI, a passivation layer PAS and a planarization layer PL are sequentially stacked on a substrate 110. A nano base layer IT is deposited on the planarization layer PL. The nano base layer IT can include a first nano base layer IT1 and a second nano base layer IT2. The first nano base layer IT1 can have a first thickness. The second nano base layer IT2 can have a second thickness thinner than the first thickness.

The first nano base layer IT1 having the first thickness can be formed at the white sub-pixel SPW, the red sub-pixel SPR and the blue sub-pixel SPB. Further, the second nano base layer IT2 having the second thickness can be formed at the green sub-pixel SPG.

A first buffer layer SIN can be deposited on the first nano base layer IT1 and the second nano base layer IT2 over the entire substrate 110. The first buffer layer SIN can include a nitride material. For example, the first buffer layer SIN can be made of a silicon nitride. For another example, the first buffer layer SIN can have a multi-layered structure of an inorganic material.

During a depositing process of the first buffer layer SIN, hydrogen particles can combined with oxygen included in the indium-tin-oxide material of the nano base layer IT, so the indium material can be precipitated to form the nano patterns NP. In particular, the first nano pattern NP1 having the first size can be formed on the first nano base layer IT1.

Further, the second nano pattern NP2 having the second size smaller than the first size can be formed on the second nano base layer IT2.

The first buffer layer SIN can be deposited as a covering for the first nano base layer IT1 and the second nano base layer IT2 over the entire substrate 110. As the first buffer layer SIN can be made of an inorganic material, first buffer layer SIN can reflect or take on the uneven profile of the first nano patterns NP1 and the second nano patterns NP2. So, the first buffer layer SIN can have an uneven (not flattened) top surface.

A pixel contact hole PH exposes a portion of the drain electrode DD of the driving thin film transistor DT at the passivation layer PAS, a planarization layer PL and the first buffer layer SIN. An anode electrode ANO is formed on the first buffer layer SIN. Therefore, the anode electrode ANO can have an uneven upper surface by reflecting or taking on the protrusion shapes of the first nano patterns NP1 and the second nano patterns NP2 reproduced or projected on the upper surface of the first buffer layer SIN.

According to the sixth embodiment of the present disclosure, the white sub-pixel SPW, the red sub-pixel SPR and the blue sub-pixel SPB include the first nano patterns NP1 having the first size. The green sub-pixel SPG includes the second nano patterns NP2 having the second size smaller than the first size. In this way, by forming the nano patterns differently for each sub-pixel, the efficiency and color gamut of the emission layer EL can be applied differently for each color assigned to each sub-pixel.

In the above description, the case in which the second nano patterns NP2 are disposed only in the green sub-pixel SPG has been explained as an example. However, it is not limited thereto. The second nano patterns NP2 having a different size from the first nano patterns NP1 disposed in other sub-pixels can be disposed in at least any one of the four sub-pixels or the plurality of sub-pixels.

In addition, the four sub-pixels can be formed to include the nano patterns of different sizes from each other. For example, the white sub-pixel SPW can include first nano patterns, the red sub-pixel SPR can include second nano patterns, the green sub-pixel SPG can include third nano patterns, and the blue sub-pixel SPB can include fourth nano patterns. Here, the first to fourth nano patterns can have different sizes from each other.

In the sixth embodiment, the case in which the second nano patterns NP2 are disposed in a specific sub-pixel in the case of having the cross-sectional structure according to the second embodiment shown in FIG. 6 has been explained. However, it is not limited thereto. The nano patterns having different sizes can be formed in at least one sub-pixel even in the case of having the cross-sectional structure according to the first and third to fifth embodiments.

Seventh Embodiment

Figure 12:
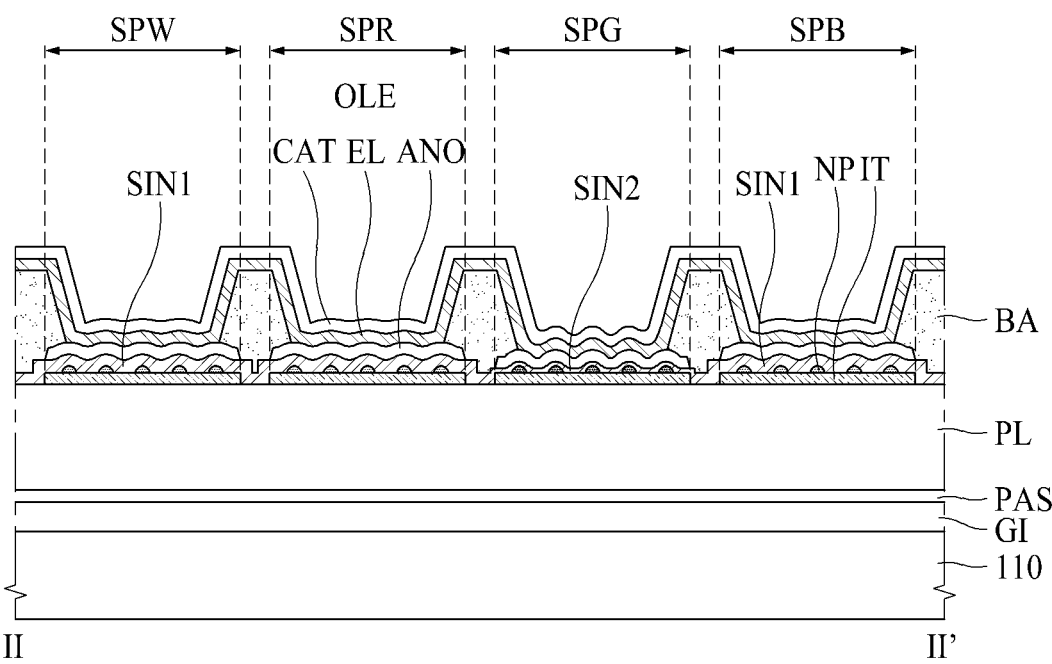
FIG. 12 is a cross sectional view, cutting along line II-II' in FIG. 10, for illustrating a structure of the light emitting display according to a seventh embodiment of the present disclosure.

Hereinafter, referring to FIG. 12, a structure of the light emitting display according to the seventh embodiment will be explained. FIG. 12 is a cross sectional view, cutting along line II-II' in FIG. 10, for illustrating a structure of the light emitting display according to the seventh embodiment of the present disclosure.

A light emitting display according to the seventh embodiment of the present disclosure includes a plurality of pixels arrayed in a matrix manner on the substrate 110. One pixel P can include four sub-pixels. For example, one pixel P can include a white sub-pixel SPW, a red sub-pixel SPR, a green sub-pixel SPG and a blue sub-pixel SPB.

Referring to FIG. 12 illustrating a cross-sectional structure of the light emitting display, a gate insulating layer GI, a passivation layer PAS and a planarization layer PL are sequentially stacked on a substrate 110. The nano base layer IT can be separately and/or independently formed at each sub-pixel. The nano base layers IT formed at each sub-pixel can have the same thickness.

A first buffer layer SIN can be deposited on the first nano base layer IT1 and the second nano base layer IT2 over the entire substrate 110. The first buffer layer SIN can include a nitride material. For example, the first buffer layer SIN can be made of a silicon nitride. For another example, the first buffer layer SIN can have a multi-layered structure of an inorganic material.

During a depositing process of the first buffer layer SIN, hydrogen particles can be combined with oxygen included in the indium-tin-oxide material of the nano base layer IT, so the indium material can be precipitated to form the nano patterns NP. The first buffer layer SIN can be deposited as a covering for the nano base layer IT having the nano patterns NP on the entire substrate 110. As the first buffer layer SIN can be made of an inorganic material, first buffer layer SIN can reflect or take on the uneven profile of the first nano patterns NP1 and the second nano patterns NP2. So, the first buffer layer SIN can have an uneven (not flattened) top surface.

Here, the first buffer layer SIN can be configured to have the first thickness at a first region (buffer layer SIN1). Meanwhile, the first buffer layer SIN can be further configured to have the second thickness different from the first thickness at a second region. For example, the white sub-pixel SPW, the red sub-pixel SPR and the blue sub-pixel SPB can be defined to the first region, and the green sub-pixel SPG can be defined to the second region. In this case, the first buffer layer SIN can be configured to have the first thickness at the first region (buffer layer SIN1), and to have the second thickness thinner than the first thickness at the second region (buffer layer SIN2).

As a result, the nano patterns NP in all sub-pixels can have the same size, but the sizes of the reproduced or projected nano patterns NP to the first buffer layer SIN can be different in the first region and in the second region. For example, the thickness of the first buffer layer SIN deposited in the second region can be thinner than the first buffer layer SIN deposited in the first region, so that the size of the reproduced or projected nano pattern NP to the upper surface of the first buffer layer SIN at the second region can be smaller than the size of the reproduced nano pattern NP to the upper surface of the first buffer layer SIN at the first region.

According to the seventh embodiment, the reproduced or projected nano pattern NP to the first buffer layer SIN at the white sub-pixel SPW, the red sub-pixel SPR and the blue sub-pixel SPB can have the first size. Meanwhile, at the green sub-pixel SPG, the reproduced or projected nano pattern NP to the first buffer layer SIN can have the second size smaller than the first size. In this way, the sizes of the nano patterns can be the same, but the thicknesses of the first buffer layer SIN can be varied so that the 'size effect' of the reproduced or projected nano patterns NP to the first buffer layer SIN appears differently for each sub-pixel. Therefore, efficiency and color gamut of the emission layer EL can be applied differently for each color assigned to each sub-pixel.

In the above description, the case in which the green sub-pixel SPG has the first buffer layer SIN formed with different thickness is explained. However, embodiments of the present disclosures are not limited thereto. The first buffer layer SIN can have different thicknesses at any one of the four sub-pixels.

In addition, the four sub-pixels can be formed to have different 'size effects' from each other, in which the size of the nano patterns are same but the effect to the emission layer EL is different by the different sizes of the reproduced or projected nano patterns due to the different thicknesses of the first buffer layer SIN on the nano patterns NP. For example, the first buffer layer SIN can be formed to have the first thickness at the white sub-pixel SPW, to have the second thickness at the red sub-pixel SPR, to have the third thickness at the green sub-pixel SPG and to have the fourth thickness at the blue sub-pixel SPB. Here, the first to fourth thicknesses can be different from each other.

In the sixth embodiment, the case in which the first buffer layer SIN is disposed as having different thicknesses at a specific sub-pixel from other sub-pixels in the case of having the cross-sectional structure according to the second embodiment shown in FIG. 6 has been explained. However, embodiments of the present disclosure are not limited thereto. The first buffer layer SIN can be formed to have different thicknesses in at least one sub-pixel even in the case of having the cross-sectional structure according to the first and third to fifth embodiments.

Eighth Embodiment

Figure 13:
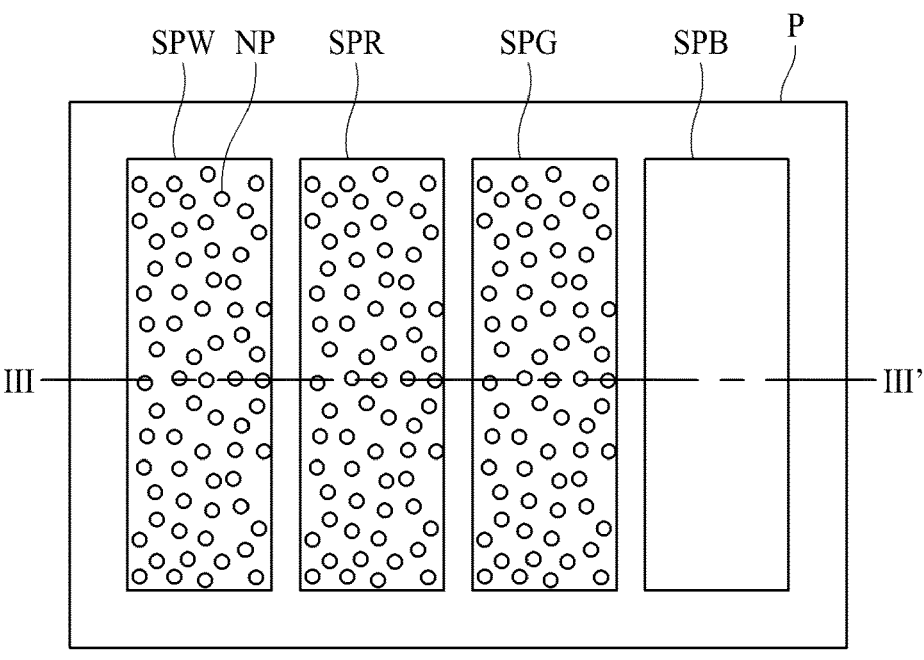
FIG. 13 is an enlarged plane view illustrating a structure of four sub pixels included in one pixel disposed in the light emitting display according to an eighth embodiment of the present disclosure.
Figure 14:
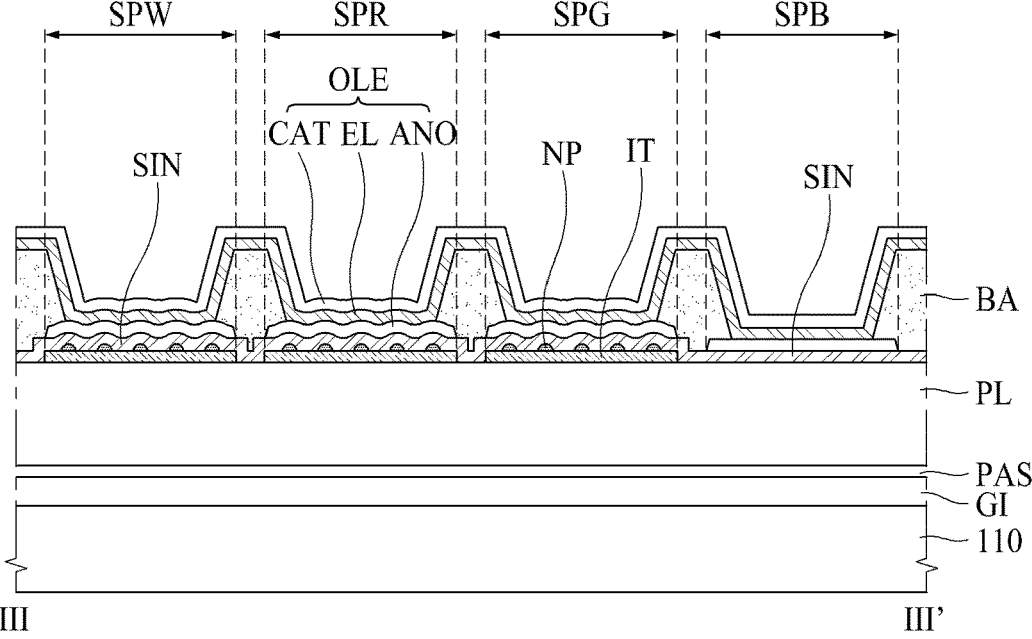
FIG. 14 is a cross-sectional view, cutting along line III-III' in FIG. 13, for illustrating a structure of the light emitting display according to a ninth embodiment of the present disclosure.

Hereinafter, referring to FIGS. 13 and 14, a structure of the light emitting display according to the eighth embodiment will be explained. FIG. 13 is an enlarged plane view illustrating a structure of four sub pixels included in one pixel disposed in the light emitting display according to the eighth embodiment of the present disclosure. FIG. 14 is a cross-sectional view, cutting along line III-III' in FIG. 13, for illustrating a structure of the light emitting display according to the ninth embodiment of the present disclosure.

A light emitting display according to the eighth embodiment of the present disclosure includes a plurality of pixels arrayed in a matrix manner on the substrate 110. Referring to FIG. 13, one pixel P can include four sub-pixels. For example, one pixel P can include a white sub-pixel SPW, a red sub-pixel SPR, a green sub-pixel SPG and a blue sub-pixel SPB, for example. Other number or color of sub-pixels can be used.

At any one sub-pixel among four sub-pixels need not have the nano patterns. For example, nano patterns NP having a predetermined diameter are distributed at the white sub-pixel SPW, the red sub-pixel SPR and the green sub-pixel SPG. However, there may be no nano pattern at the blue sub-pixel SPB.

In detail, the nano base layer IT is formed on the buffer layer BUF. For example, each of the four sub-pixels SPW, SPR, SPG and SPB can have a nano base layer IT separated per each sub-pixels. The nano base layer IT can have a thickness of 100 Å to 200 Å at the white sub-pixel SPW, the red sub-pixel SPR and the green sub-pixel SPG. However, the blue sub-pixel SPB can have no nano base layer. With applying of a hydrogen gas, the nano patterns NP can be formed at the upper surface of the nano base layer IT. Then, nano patterns NP having a diameter of 1,000 Å to 2,000 Å can be formed at the white sub-pixel SPW, the red sub-pixel SPR and the green sub-pixel SPG, but the nano patterns NP are not formed at the blue sub-pixel SPB.

In the above description, the case in which only the blue sub-pixel SPB does not have any nano patterns NP is explained. However, embodiments of the present disclosure are not limited thereto. At least any one sub-pixel among the four sub-pixels need not have the nano patterns.

In addition, three sub-pixels having the nano patterns NP can be formed to include nano patterns NP of different sizes from each other. For example, the white sub-pixel SPW can include first nano patterns, the red sub-pixel SPR can include second nano patterns, and the green sub-pixel SPG can include third nano patterns. However, the blue sub-pixel SPB does not have to have any nano patterns NP. Here, the first to third nano patterns can have different sizes from each other.

In the eighth embodiment, the case in which the nano patterns NP are not disposed in a specific sub-pixel in the case of having the cross-sectional structure according to the second embodiment shown in FIG. 6 has been explained. However, embodiments of the present disclosure are not limited thereto. The nano patterns need not be formed at any one sub-pixel among the plurality of sub-pixel even in the case of having the cross-sectional structure according to the first and third to seventh embodiments. For example, the nano patterns, need not be formed in each and every sub-pixel, and one or more of the sub-pixels can lack the nano patterns.

In one or more embodiments of the present disclosure, the nano patterns NP need not be discrete distributions of nano patterns NP as provided in FIGS. 4-10 and FIG. 13, for example, but each element of the nano patterns NP can be connected, partially connected or clumped in patterns that are either random or in regular patterns.

In one or more embodiments of the present disclosure, the nano base layer IT is provided on the planarization layer PL or the second buffer layer BUF, and the first buffer layer SIN is then provided on the nano base layer IT. Meanwhile, in other embodiments, the first buffer layer SIN can be first deposited on the planarization layer PL or the second buffer layer BUF, and then the nano base layer IT can be provided on the first buffer layer SIN to provide the nano patterns NP between the first buffer layer SIN and the nano base layer IT.

Further, the nano base layer IT need not be a sheet covering the entire light emitting area EA, but can be a plurality of portions that are divided. In this embodiment, the first buffer layer SIN can be provided between each portion of the nano base layer IT so that the first buffer layer SIN is able to directly contact the underlying planarization layer PL or the second buffer layer BUF.

In other embodiments, the nano base layer IT can be provided as a multilayer having at least two layers, where each layer includes differing concentrations of materials such as indium. For example, of the two layers of the multilayered nano base layer IT, a first layer that contacts the first buffer layer SIN can have a greater concentration of indium than a second layer not contacting the first buffer layer SIN so that the first layer is able to provide more indium to ease precipitation of indium that forms the nano patterns NP.

In other embodiments, the nano base layer IT can be provided as a single layer having at least two portions, where each portion includes differing concentrations of materials such as indium. For example, of the two portions of the nano base layer IT, a first portion that contacts the first buffer layer SIN can have a greater concentration of indium than a second portion not contacting the first buffer layer SIN so that the first portion is able to provide more indium to ease precipitation of indium that forms the nano patterns NP.

In other embodiments, when the anode electrode ANO includes the metal oxide material such as indium-zinc-oxide (IZO) or indium-tin-oxide (ITO), the anode electrode ANO can be the source of the indium to precipitate the indium containing nano patterns NP when the anode electrode ANO is deposited directly on the first buffer layer SIN, for example. In this instance, a portion of the anode electrode ANO being deposited first on the first buffer layer SIN may be richer in indium than a later portion of the anode electrode ANO being deposited in order to provide ample source of the indium for generating precipitates that form the nano patterns NP.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment can be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. A light emitting display comprising:
a substrate including a display area having a pixel, and a non-display area adjacent to the display area;
a planarization layer on the substrate;
a nano base layer including indium and on the planarization layer, and having a plurality of nano patterns on an upper surface of the nano base layer;
a first buffer layer on the nano base layer;
an anode electrode on the first buffer layer at the pixel;
a bank covering a periphery area of the anode electrode and exposing a central area of the anode electrode to define an emission area of the pixel at the exposed central area;
an emission layer on the anode electrode; and
a cathode electrode on the emission layer.

2. The light emitting display according to claim 1, wherein:
the nano base layer is disposed over the display area, or
the nano base layer is disposed at an area corresponding to the emission area.

3. The light emitting display according to claim 1, further comprising:
a second buffer layer between the nano base layer and the planarization layer.

4. The light emitting display according to claim 3, wherein the second buffer layer includes silicon nitride layer, or both the silicon nitride layer and a silicon oxide layer.

5. The light emitting display according to claim 3, further comprising:
a metal layer between the second buffer layer and the planarization layer.

6. The light emitting display according to claim 5, wherein:
the metal layer is not overlapped with the nano base layer, and is disposed in the display area, or
the metal layer is disposed over the entire display area.

7. The light emitting display according to claim 5, wherein the metal layer include any one of copper (Cu), molybdenum (Mo), titanium (Ti) and an alloy thereof.

8. The light emitting display according to claim 1, wherein the first buffer layer includes a silicon nitride layer, or both the silicon nitride layer and a silicon oxide layer.

9. The light emitting display according to claim 1, wherein the pixel includes a first pixel and a second pixel,
wherein the nano base layer includes a first nano base layer disposed at the first pixel, and a second nano base layer disposed at the second pixel,
wherein the first nano base layer has a first thickness, and
wherein the second nano base layer has a second thickness thinner than the first thickness.

10. The light emitting display according to claim 9, wherein the plurality of nano patterns include:
a first nano pattern distributed on the first nano base layer; and
a second nano pattern distributed on the second nano base layer,
wherein the first nano pattern has a first size, and
wherein the second nano pattern has a second size smaller than the first size.

11. The light emitting display according to claim 1, wherein the pixel includes a first pixel and a second pixel,
wherein the first buffer layer is disposed at the first pixel with a first thickness, and at the second pixel with a second thickness, and
wherein the second thickness is thinner than the first thickness.

12. The light emitting display according to claim 10, wherein the first nano pattern to the first buffer layer in the first pixel has a first projected size, and
wherein the second nano pattern to the first buffer layer in the second pixel has a second projected size that is smaller than the first projected size.

13. The light emitting display according to claim 1, wherein the pixel includes a first pixel and a second pixel,
wherein the nano base layer is disposed at the first pixel, and
wherein the nano base layer is not disposed at the second pixel.

14. The light emitting display according to claim 13, wherein, at the first pixel, the plurality of nano patterns are distributed between the nano base layer and the first buffer layer, and
wherein, at the second pixel, the plurality of nano patterns are not disposed under the first buffer layer.

15. A light emitting display comprising:
a substrate including a display area having a pixel, and a non-display area adjacent to the display area;
a base layer on the substrate, and containing indium;
a first buffer layer on the substrate, and containing silicon;
a plurality of nano patterns interposed between the base layer and the first buffer layer, and containing indium;
a light emitting diode on the base layer, the plurality of nano patterns, and the first buffer layer; and a bank exposing an area of the light emitting diode to define an emission area of the pixel at the exposed area.

16. The light emitting display according to claim 15, wherein the light emitting diode includes:

an anode electrode;

an emission layer on the anode electrode; and a cathode electrode on the emission layer, and wherein the base layer and the anode electrode are a same layer.

17. The light emitting display according to claim 15, wherein the base layer includes a first part and a second part, the first part being in contact with the first buffer layer, and wherein a concentration of indium in the first part is greater than that of the second part.

18. The light emitting display according to claim 15, wherein the base layer includes a plurality of portions that are separated from each other, and wherein portions of the first buffer layer are interposed between the plurality of portions of the base layer, respectively.

19. The light emitting display according to claim 15, wherein at least two of the plurality of nano patterns are connected to each other.

* * * * *